United States Patent
Parthasarathy et al.

(10) Patent No.: US 7,948,163 B2
(45) Date of Patent: May 24, 2011

(54) SMALL MOLECULE/POLYMER ORGANIC LIGHT EMITTING DEVICE CAPABLE OF WHITE LIGHT EMISSION

(75) Inventors: Gautam Parthasarathy, Saratoga Springs, NY (US); Christian Maria Anton Heller, Albany, NY (US)

(73) Assignee: General Electric Company, Niskayuna, NY (US)

( * ) Notice: Subject to any disclaimer, the term of this patent is extended or adjusted under 35 U.S.C. 154(b) by 719 days.

(21) Appl. No.: 11/765,161

(22) Filed: Jun. 19, 2007

(65) Prior Publication Data
US 2008/0231174 A1    Sep. 25, 2008

Related U.S. Application Data

(63) Continuation-in-part of application No. 10/712,093, filed on Nov. 14, 2003, now abandoned.

(51) Int. Cl.
*H01L 51/50* (2006.01)
*H01L 51/52* (2006.01)
(52) U.S. Cl. ........................................ 313/503
(58) Field of Classification Search .................. None
See application file for complete search history.

(56) References Cited

U.S. PATENT DOCUMENTS

| | | | | |
|---|---|---|---|---|
| 6,866,678 B2* | 3/2005 | Shenderova et al. | ............ | 607/88 |
| 2005/0164019 A1* | 7/2005 | Liu et al. | ........................ | 428/457 |

OTHER PUBLICATIONS

Yuan-Min Wang, Feng Teng, Zheng Xu, Yan-Bing Hou, Sheng-Yi Yang, Lei Qian, Ting Zhang, De-Ang Liu, White emission via electroplex formation at poly(N-vinylcarbazole)/2,9-dimethyl-4,7-diphenyl-1,10-phenanthroline interface, Applied Surface Science, vol. 236, Issues 1-4, Sep. 15, 2004, pp. 251-255, ISSN 0169-4332, DOI: 10.1016/j.apsusc.2004.0.*

Yuanmin Wang, Feng Teng, Zheng Xu, Yanbing Hou, Yongsheng Wang, Xurong Xu, Electroplex emission from a blend of poly(N-vinylcarbazole) and 2,9-dimethyl-4,7-diphenyl-1,10-phenanthroline, European Polymer Journal, vol. 41, Issue 5, May 2005, pp. 1020-1023, ISSN 0014-3057, DOI: 10.1016/j.eurpolymj.2004.11.026. (http://www.sciencedirect.com/scienc.*

Jihua Yang, Keith C. Gordon, Organic light emitting devices based on exciplex interaction from blends of charge transport molecules, Chemical Physics Letters, vol. 375, Issues 5-6, Jul. 10, 2003, pp. 649-654, ISSN 0009-2614, DOI: 10.1016/S0009-2614(03)00950-3. (http://www.sciencedirect.com/science/article/B6TFN-48XCNBD-V/2/d80b4afba2179fb21ace68.*

(Continued)

*Primary Examiner* — Toan Ton
*Assistant Examiner* — Britt D Hanley
(74) *Attorney, Agent, or Firm* — Mary Louise Gioeni (57) ABSTRACT

The present invention is directed to a method for producing white light. The method includes applying a voltage to an organic light emitting device including a light emissive layer directly adjacent to a layer comprising at least one small molecule material capable of hole blocking and electron transport, the light emissive layer including at least one blue light emissive polymer, where the at least one small molecule material and the at least one blue light emissive polymer form a light emissive exciplex at or near an interface of the light emissive layer and the layer including the at least one small molecule material.

11 Claims, 6 Drawing Sheets

OTHER PUBLICATIONS

Parthasarathy et al, "Organic Light Emitting Devices From Displays to Lighting", The Electrochemical Society Interface, pp. 42-47, Summer 2003.

Duggal et al., "Organic Light-Emitting Devices for Illumination Quality White Light", Applied Physics Letters, vol. 80, No. 19, pp. 3470-3472, May 13, 2002.

Van Slyke et al., "Organic Electroluminescent Devices With Improved Stability", Applied Physics Letters, vol. 69, No. 15, pp. 2160-2162, Oct. 7, 1996.

Giebeler et al., "Space-Charge-Limited Charge Injection From Indium Tin Oxide Into a Starburst Amine and Its Implications for Organic Light-Emitting Diodes", Applied Physics Letters, vol. 72, No. 19, pp. 2448-2450, May 11, 1998.

Wang et al., "Influence of the Hole Blocking Materials on the Luminous Properties of Highly Efficient Blue Organic Light-Emitting Diodes", Proceedings of SPIE, vol. 4918, pp. 170-178, 2002.

Hill et al., "Organic Semiconductor Heterointerfaces Containing Bathocuproine", Journal of Applied Physics, vol. 86, No. 8, pp. 4515-4519, Oct. 15, 1999.

Wu et al., "Improved Efficiency of Organic Light-Emitting Devices Employing Bathocuproine Doped in the Electron-Transporting Layer", Institute of Physics Publishing, Semiconductor Science and Technology, vol. 18, pp. L49-L52, 2003.

Kido et al., Single-Layer White Light-Emitting Organic Electroluminescent Devices Based on Dye-Dispersed Poly(N-vinylcarbazole), Applied Physics Letters, vol. 67, No. 16, pp. 2281-2283, Oct. 16, 1995.

Thompson et al., "White Light Emission From Blends of Blue-Emitting Organic Molecules: A General Route to the White Organic Light-Emitting Diode?", Applied Physics Letters, vol. 79, No. 5, pp. 560-562, Jul. 30, 2001.

Jiang et al., Bright and Efficient Exciplex Emission From Light-Emitting Diodes Based on Hole-Transporting Amine Derivatives and Electron-Transporting Polyfluorenes, Journal of Applied Physics, vol. 91, No. 12, pp. 10147-10152, Jun. 15, 2002.

Mazzeo et al., "Organic Single-Layer White Light-Emitting Diodes by Exciplex Emission From Spin-Coated Blends of Blue-Emitting Molecules", Applied Physics Letters, vol. 82, No. 3, pp. 334-336, Jan. 20, 2003.

Pallis et al, "Highly Efficient Molecular Organic Light-Emitting Diodes Based on Exciplex Emission", Applied Physics Letters, vol. 82, No. 14, pp. 2209-2211, Apr. 7, 2003.

Suzuki et al., "Near-Ultraviolet Electroluminescence From Polysilanes", Thin Solid Films, vol. 331, pp. 64-70, 1998.

Okada et al., "43.4: A 4-Inch Reflective Color TFT-LCD Using a Plastic Substrate", SID 02 Digest, pp. 1204-1207, 2002.

* cited by examiner

SMALL MOLECULE/POLYMER ORGANIC LIGHT EMITTING DEVICE CAPABLE OF WHITE LIGHT EMISSION

CROSS REFERENCE TO RELATED APPLICATIONS

This application is a continuation-in-part of U.S. patent application Ser. No. 10/712,093, entitled "AN ORGANIC LIGHT EMITTING DEVICE CAPABLE OF WHITE LIGHT EMISSIONS AND METHOD FOR MAKING THE SAME", filed Nov. 14, 2003, which is herein incorporated by reference.

BACKGROUND OF THE INVENTION

The present invention relates generally to the field of lighting and displays, and more particularly to an organic light emitting device capable of white light emissions and a method for producing white light emissions.

Electroluminescent ("EL") devices, which may be classified as either organic or inorganic, are well known in the graphic display and imaging art. EL devices have been produced in different shapes for many applications. Inorganic EL devices need to be carefully fabricated on crystalline or polycrystalline substrates and thus may prove to be more expensive. On the other hand, organic light emitting devices ("OLEDs"), which have been developed more recently, offer the benefits of low activation voltage and high brightness in addition to simple manufacture, and thus the promise of more widespread application.

An OLED is typically a thin film structure formed on a substrate such as glass or transparent plastic. A light-emitting layer of an organic EL material and optional adjacent organic semiconductor layers are sandwiched between a cathode and an anode. The organic semiconductor layers may be either hole (positive charge)-injection or electron (negative charge)-injection layers and also comprise organic materials. The material for the light-emitting layer may be selected from many organic EL materials that emit light having different wavelengths. The light emitting organic layer may itself comprise multiple sublayers, each comprising a different organic EL material.

To obtain illumination-quality lighting based on organic electroluminescence, a number of solutions have been explored and proposed. For example, one solution utilizes closely arranged OLEDs emitting blue, green, and red light. These colors are mixed to produce white light. In a similar approach, people have achieved white light emissions by incorporating one or more different color fluorescent or phosphorescent dyes into a single OLED. Another approach involves the use of a blue OLED and down-conversion materials to convert some of the blue light into other colors.

However, none of the existing techniques are particularly effective in producing efficient, high accuracy white light. In addition, the use of multiple emissive species gives rise to differential aging of the components of the device with a consequent color change over time as the device ages.

These and other drawbacks exist in known systems and techniques.

BRIEF SUMMARY OF THE INVENTION

The present invention is directed to an organic light emitting device capable of white light emissions and a method for producing white light emissions.

According to one embodiment, the invention relates to a method for producing white light. The method includes applying a voltage to an organic light emitting device including a light emissive layer directly adjacent to a layer comprising at least one small molecule material capable of hole blocking and electron transport; the light emissive layer including at least one blue light emissive polymer; wherein the at least one small molecule material and the at least one blue light emissive polymer form a light emissive exciplex at or near an interface of the light emissive layer and the layer including the at least one small molecule material.

According to another embodiment, the invention relates to an organic light emitting device capable of white light emissions. The device includes a light emissive layer including at least one light emissive polymer directly adjacent to a layer including at least one small molecule material capable of hole blocking and electron transport, wherein the at least one small molecule material and the at least one light emissive polymer are capable of forming an exciplex at or near an interface of the light emissive layer and the layer including the at least one small molecule material.

According to still another embodiment, the invention relates to an organic light emitting device capable of white light emissions. The device includes a light emissive layer including at least one light emissive polyfluorene material directly adjacent to a layer including at least one small molecule material capable of hole blocking and electron transport, wherein the at least one small molecule material and the at least one polyfluorene material are capable of forming an exciplex at or near an interface of the light emissive layer and the layer including the at least one small molecule material.

According to yet another embodiment, the invention relates to a method for color tuning an organic light emitting device emission. The method includes applying a voltage to an organic light emitting device, the device including at least one blue light emitting polyfluorene and at least one small molecule material adjacent to the at least one blue light emitting polyfluorene, wherein the at least one small molecule material functions as both a hole blocking and an electron transport material, and wherein upon application of a voltage, the device emits emission including emission from the at least one blue light emitting polyfluorene at a first wavelength range and emission from an exciplex formed at the interface of the blue light emitting polyfluorene with the small molecule material at a second wavelength range different from the first wavelength, wherein color tuning is achieved by varying the voltage.

BRIEF DESCRIPTION OF THE DRAWINGS

In order to facilitate a fuller understanding of the present invention, reference is now made to the appended drawings, in which like elements are referenced with like numerals. These drawings should not be construed as limiting the present invention, but are intended to be exemplary only.

DETAILED DESCRIPTION OF THE INVENTION

Reference will now be made in detail to the present embodiments of the invention, examples of which are illustrated in the accompanying drawings.

As used herein, an exciplex is a short-lived heterodimeric molecule formed from two species, at least one of which is in an electronically excited state.

As used herein, the term "efficient exciplex emission" refers to at least about 5% of the formed exciplexes emit radiatively.

As used herein, the term "exciton" refers to a bound state of an electron and a hole.

Conventionally, exciplex emissions have been considered as an inefficient mechanism for radiation emission and typically in an OLED device as an undesirable emission feature often dominated by fluorescence or exciton emissions from the organic light emitting material. In contrast, the Applicants have discovered how to produce efficient exciplex emission and how to use the efficient exciplex emission to produce white light. In one embodiment, white light emission is achieved by using a light emitting polymer adjacent to a small molecule material through the formation of an exciplex at the interface of the light emitting polymer and the small molecule material. The Applicants have recognized that combinations of certain light emitting polymers and hole blocking materials can lead to the formation of efficient exciplexes. Not all combinations of light emitting polymers with small molecule materials will lead to the formation of efficient exciplexes. The Applicants have recognized that under certain conditions, efficient exciplexes can be formed and the exciplex emission in combination with the emission from the light emitting polymer may render the device capable of white light emission.

In one embodiment, is an organic light emitting device capable of white light emissions, wherein during operation at least 5% of the formed exciplexes emit radiatively. In a further embodiment, is an organic light emitting device capable of white light emissions, wherein during operation a percentage of the formed exciplexes in a range from about 5% to about 25% emit radiatively. In another embodiment, is an organic light emitting device capable of white light emissions, wherein during operation a percentage of the formed exciplexes in a range from about 25% to about 60% emit radiatively. In still another embodiment, is an organic light emitting device capable of white light emissions, wherein during operation a percentage of the formed exciplexes in a range from about 60% to about 100% emit radiatively.

Figure 1:
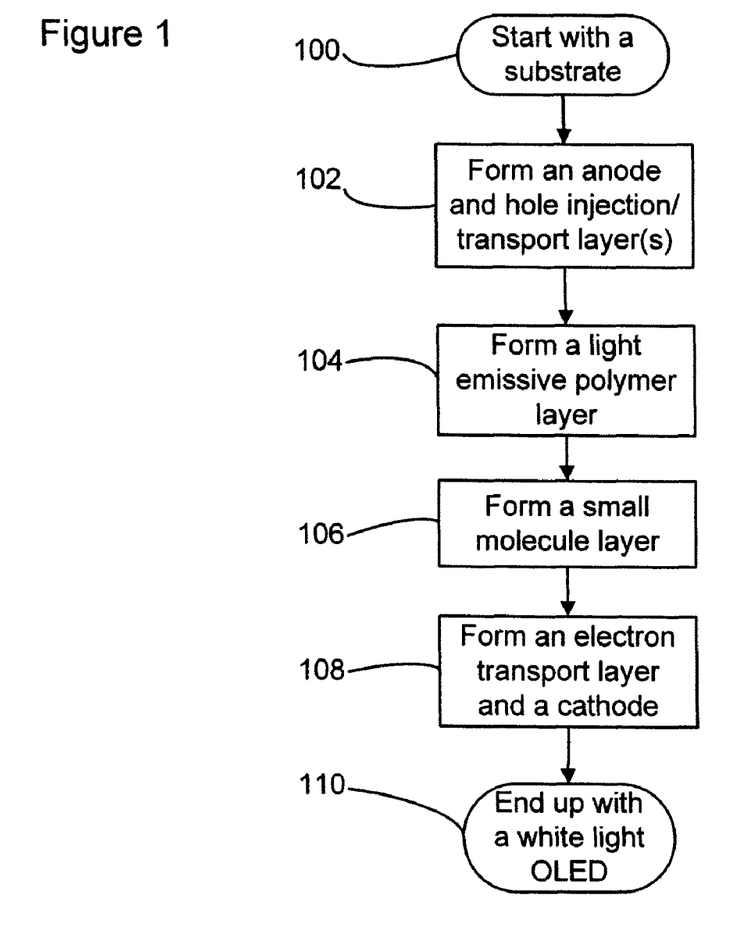
FIG. 1 is a flow chart illustrating an exemplary method for making an organic light emitting device according to an embodiment of the invention.

FIG. 1 is a flow chart illustrating an exemplary method for making an organic light emitting device according to an embodiment of the invention.

The exemplary method starts at step 100, where a substrate may be provided. The substrate may be made of a substantially transparent glass or polymeric material, for example. Examples of suitable polymeric materials include polyethylene terephthalate (PET), polyacrylates, polycarbonates, polyesters, polysulfones, polyetherimides, silicone, epoxy resins, and silicone-functionalized epoxy resins. In addition, an opaque substrate such as metal foils may be used, if a transparent top electrode (cathode) is chosen, for example.

At step 102, an anode and an optional hole injection layer and/or hole transport layer may be formed on top of the substrate. A typical anode layer may comprise indium tin oxide (ITO) or aluminum doped zinc oxide (AZO), for example, though other materials known in the art may also be used. The transparent anode materials may be formed, for example, in a physical vapor deposition (PVD) process or other suitable process. For example, ITO may be sputtered onto the substrate to form the anode layer. The anode material may be patterned either by using a shadow mask during deposition or via photolithographic steps after the deposition, for example.

According to embodiments of the invention, it may also be desirable to form additional layers, such as an optional hole injection layer and/or hole transport layer, on top of the anode. A hole injection layer may serve to improve the efficiency of hole injections from the anode. Suitable materials for the hole injection layer include polyethylenedioxythiophene (PDOT), copper phthalocyanine (CuPc), 4,4',4"-tris{N,-(3-methylphenyl)-N-phenylamino}triphenylamine (m-MTDATA), and arylene-based compounds such as 3,4,9,10-perylenetetra-carboxylic dianhydride or bis(1,2,5-thiadiazolo)-p-quinobis(1,3-dithiole), for example. A hole transport layer may be disposed between the hole injection layer and a subsequent organic light emissive layer. The hole transport layer may have the functions of transporting holes and blocking the transportation of electrons so that holes and electrons may be combined in or near the organic light emissive layer. Materials suitable for the hole transport layer include, for example, triaryldiamine, tetraphenyldiamine, aromatic tertiary amines, hydrazone derivatives, carbazole derivatives, triazole derivatives, imidazole derivatives, oxadiazole derivatives having an amino group, polythiophenes, and N,N'-diphenyl-N,N'-bis(1-naphthylphenyl)-1,1'-biphenyl-4,4'-diamine (α-NPD). The organic hole injection layer and/or hole transport layer may be formed in a solution-cast process. According to one embodiment, a PDOT layer approximately 65 nanometers thick may be incorporated.

At step 104, a light emissive polymer layer may be formed on top of the aforementioned layers. The light emissive polymer may comprise a polyfluorene (PF)-based blue emissive polymer, for example. According to one embodiment of the invention, the light emissive polymer may comprise a high-efficiency polyfluorene-based blue emissive polymer. Other light emissive polymer materials, such as poly(p-phenylene vinylenes), polyphenylenes, polythiophene, polyquinolines, polyfluorenes, poly(vinylcarbazole), polystyrene with quaterphenylene segments, poly(disilanyleneoligothienylene), and their derivatives and mixtures, may also be used. The light emissive polymer layer may be formed in a solution-cast process. For example, a solution may be prepared by dissolving the light emissive polymer into a suitable solvent. Then the solution may be spin-cast onto the sample, causing a uniform layer of the light emissive polymer to be deposited. According to one exemplary embodiment, the polyfluorene-based blue light emissive polymer layer may be approximately 70 nanometers thick. Other processing techniques may also be used to form the light emissive polymer layer.

At step 106, a distinct layer of small molecule material may be formed on top of the light emissive polymer layer. According to embodiments of the invention, it may be desirable to choose a small molecule material that in combination with the light emitting polymer produces an efficient exciplex. In some embodiments, the small molecule material has a wide bandgap, a high electron mobility and a LUMO (Lowest Unoccupied Molecular Orbital) value that has a minimal or small offset from the LUMO values of the two neighboring layers, such that it may function as both a hole-blocking layer and an electron transport layer. In one embodiment, a HOMO offset of the small molecule material with respect to the light emissive polymer is greater than about 0.5 eV.

In some embodiments, the bandgap of the small molecule material may be larger than the emissive blue layer by about 0.5 to about 2 eV. The electron mobility may be greater than about $10^{-5}$ cm$^2$/Vs at an electric field of about 0.5 MV/cm, for example. The high electron mobility and a matching LUMO (preferably between the LUMOs of neighboring layers) may facilitate efficient transport of electrons and the wide bandgap may provide effective blocking of holes. As a result, some fraction of the injected carriers (i.e., electrons and holes) may form an excited state complex at or near the interface of the light emissive polymer and the small molecule material. This excited state complex may be referred to as an "exciplex" and typically features broad emissions deep into the red.

One suitable small molecule material is bathocuproine (BCP), a commercially available material, with a bandgap of approximately 3.5 eV and an electron mobility of approximately $10^{-3}$ cm$^2$/Vs. The layer of small molecule material such as BCP may be formed by thermal evaporation, for example. According to one embodiment, the BCP layer may have a thickness between 60 and 150 angstroms. Other hole-blocking materials, include bathocuproine derivatives such as but not limited to 2,9-diphenyl-1,10-phenanthroline, 1,10-phenanthroline, 5-phenyl-, and 2,9-dimethyl-4,7-diphenyl-1,10-phenanthroline, 3-(4-biphenyl)-4-phenyl-5 (4-tert-butylphenyl)-1,2,4-triazole (TAZ) and triazole derivatives such as but not limited to 3,4,5-triphenyl-1,2,4-triazole, 3,5-Bis(4-tert-butyl-phenyl)-4-phenyl-[1,2,4]triazole, and 3,5-Diphenyl-4-napth-1-yl-1,2,4-triazole and oxidazole derivatives such as but not limited to 2-(4'-tert-butylphenyl)-5-(4'-diphenyl)-1,3,4-oxadiazole, (PBD), bis(2-methyl-8-quinolato)(p-phenyl-phenolato)aluminum (BAlq3), 4,7-diphenyl-1,10-phenanthroline (Bphen), tetranapthylsilane (TNS) may also be utilized in place of BCP.

Table 1 illustrates measured HOMO and LUMO levels of representative light emitting polymers, in various solvents. Measurement of HOMO and LUMO levels is described in various references such as "Yang et al., Macromolecules, 2003, Volume 36, pp 7453-7460", "Andrade et al., Organic electronics, 2005, Volume 6, pp 11-20" and "Peng et al., Journal of Polymer Science: Part A: Polymer Chemistry, 2004, Volume 42, pp 2985-2993". Measurements indicate that the bandgap of many of the light emitting polymers in Table 1 are in a range greater than 2.5 eV. Especially blue light emitting polymers such as ADS120, ADS 129, ADS 254 and PVK exhibit bandgaps about 3 eV. BCP has a bandgap greater than about 3.5 eV. For example, the LUMO of BCP ($E_{LUMO}$ (BCP)) is about -2.9 eV and the HOMO of polyfluorene ($E_{HOMO}$(polyfluorene)) is about -5.8 eV. If the binding energy ($BE_{ex}$) of the exciplex is approximated to be about 1 eV, then the peak of the exciplex emission can be approximated by $$h\nu_{ex} = E_{LUMO}(BCP) - E_{HOMO}(\text{polyfluorene}) - BE_{ex}. \quad (1)$$

$$h\nu_{ex} = -2.9 \text{ eV} + 5.8 \text{ eV} - 1 \text{ eV} = 1.9 \text{ eV} \sim 650 \text{ nm} \quad (2)$$

TABLE 1

Estimated HOMO and LUMO levels

| Material | HOMO (eV) | LUMO (eV) |
|---|---|---|
| ADS 066GE (Iridium (III) tris(2-(4-tolyl)pyridinato-N,C2')) | 5.0 | 2.1 |
| ADS 067 RE (Iridium (III) bis(2-(2'-benzothienyl)pyridinato-N,C3')(acetylacetonate)) | 5.0 | <2.5 |
| ADS 069 RE (Iridium (III) Bis(1-phenylisoquinoline) (acetylacetonate)) | 5.15 | 2.7 |

TABLE 1-continued

Estimated HOMO and LUMO levels

| Material | HOMO (eV) | LUMO (eV) |
|---|---|---|
| ADS 120 BE (Poly[2-(6-cyano-6-methyl-heptyloxy)-1,4-phenylene) | 5.6 | 2.1 |
| ADS 129 BE (Poly[9,9-dioctylfluorenyl-2,7-diyl] - End capped with DMP) | 5.65 | 2.1 |
| ADS 145 UV(Poly[(9,9-dioctylfluorenyl-2,7-diyl)-co-(2,5-p-xylene)]) | 5.8-5.85 | 2.2 |
| ADS 254 BE (Poly[N,N'-bis(4-butylphenyl)-N,N'-bis(phenyl)-benzidine] - End capped with Polysilsesquioxane) | 5.1 | 1.9 |
| Polyvinyl Carbazole | 5.35 | |
| Phenyl substituted polyfluorene derivative | 5.76 | 2.85 |
| Bathocuproine | 6-6.5 | 2.9-3.2 |
| 3-(4-biphenyl)-4-phenyl-5(4-tert-butylpheny)-1,2,4-triazole | 6.2-6.8 | 2.4-2.8 |

At step 108, an optional electron transport layer, and a cathode may be formed on top of the small molecule material layer. The electron transport layer may facilitate efficient transport of electrons from the cathode into the electroluminescent core of the OLED device. Materials suitable for the electron transport layer include, for example, metal organic complexes of 8-hydroxyquinoline, such as tris(8-quinolinolato)aluminum, stilbene derivatives, anthracene derivatives, perylene derivatives, metal thioxinoid compounds, oxadiazole derivatives and metal chelates, pyridine derivatives, pyrimidine derivatives, quinoline derivatives, quinoxaline derivatives, diphenylquinone derivatives, nitro-substituted fluorene derivatives, triazines, and triazoles, chemically or electrically doped layers, e.g., with alkali metals. According to an embodiment of the invention, an approximately 250-angstrom thick tris(8-hydroxy-quinoline)aluminum (Alq$_3$) layer may be formed in a thermal evaporation process. According to another embodiment, a white light OLED may be fabricated without an Alq$_3$ layer.

The cathode layer may comprise a material having a low work function, e.g., less than about 4 eV, such as K, Li, Na, Mg, La, Ce, Ca, Sr, Ba, Al, Ag, In, Sn, Zn, Zr, Sm, Eu, alloys thereof, or mixtures thereof. Layered non-alloy structures may also be used, such as a thin layer of a metal such as Ca (thickness from about 1 to about 10 nm, for example) or a non-metal such as sodium fluoride (NaF) or lithium fluoride (LiF), covered by a thicker layer of some other metal, such as aluminum (Al) or silver (Ag). With a bi-layer cathode of Al/NaF or Al/LiF, a higher electroluminescence efficiency, external quantum efficiency and electron injection efficiency may be achieved than with a single-metal cathode. According to one exemplary embodiment, the cathode may comprise a 7-100 angstroms thick NaF layer or a 7 angstroms thick LiF layer, covered by a thick Al layer. The NaF or LiF layer may be formed in a chemical vapor deposition (CVD) process and the subsequent Al layer may be formed in an evaporation process, for example. The cathode layer(s) may be patterned depending on intended applications of the OLED.

The exemplary method ends at step 110, where a white light OLED with the above-described multilayer structure has been fabricated. Additional configuration and packaging steps may be utilized to create a final product. It should be noted that the above-described method steps may be applicable to the manufacture of both single devices and integrated systems in which a plurality of same or similar OLEDs as well as control circuitry may be combined.

Figure 2:
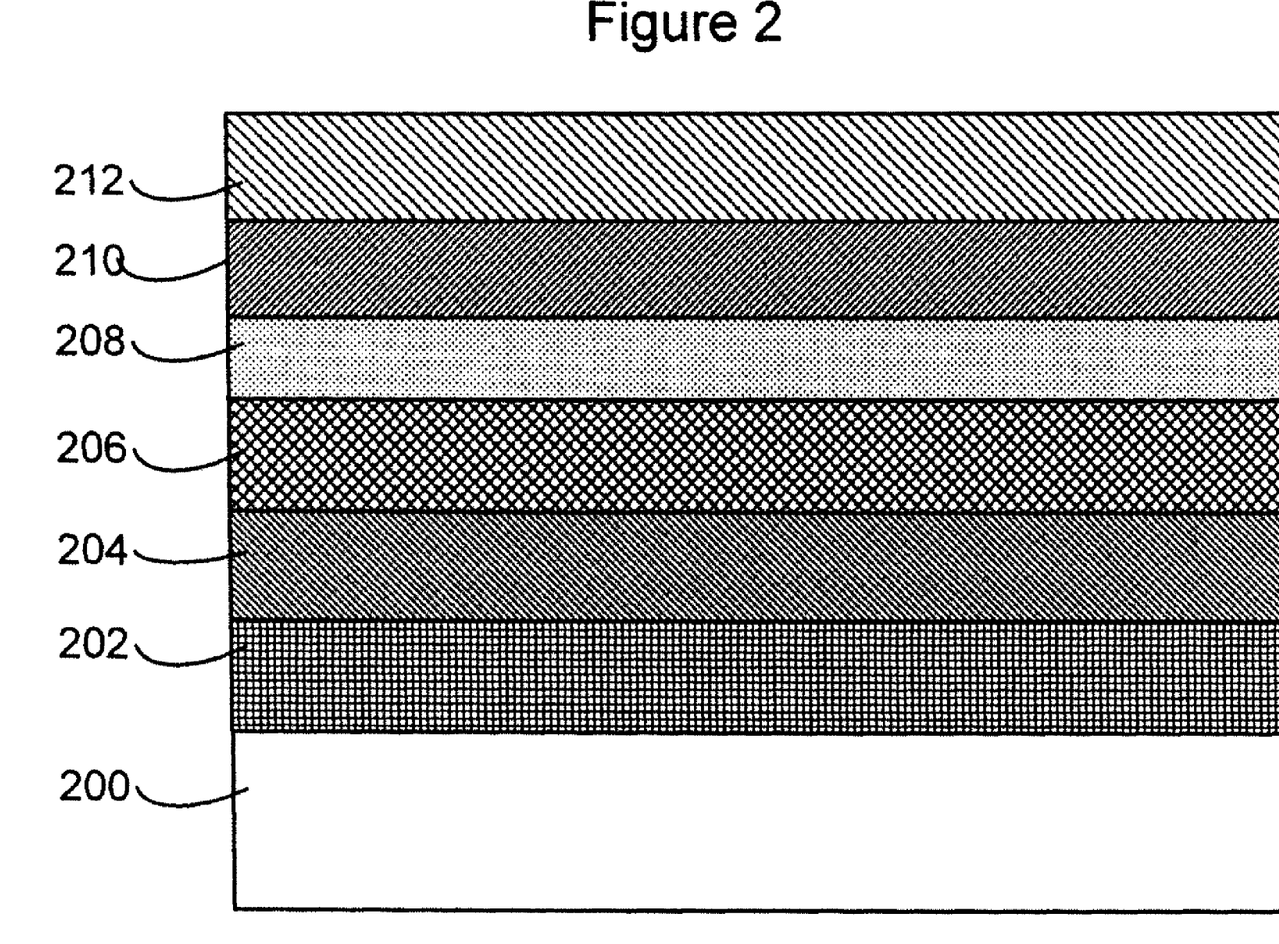
FIG. 2 illustrates a cross-sectional view of an organic light emitting device according to an exemplary embodiment of the invention.

FIG. 2 illustrates a cross-sectional view of an organic light emitting device according to an exemplary embodiment of the invention. As shown in FIG. 2, the OLED may comprise a substrate 200, an anode 202, an optional hole injection and/or hole transport layer 204, a light emissive polymer layer 206, a small molecule material layer 208, an optional electron transport layer 210, and a cathode 212. Although all the layers are shown to have the same shape, they may have different shapes, patterns and/or thicknesses depending on specific requirements in different applications. For example, in OLED display applications, the anode 202 and the cathode 212 may be patterned into bus lines to accommodate efficient addressing of individual display elements.

By applying a DC voltage between the anode 202 and the cathode 212, electrons and holes are injected and transported through the electron transport layer 210 and the hole transport layer 204, respectively. The electrons and holes may recombine, at or near the interface between the light emissive polymer layer 206 and the small molecule material layer 208, to form an excited state complex or exciplex. In one embodiment, the exciplex may subsequently give rise to emissions in a broad wavelength range. In a further embodiment, the exciplex emissions may enable the generation of white light.

In one embodiment, the exciplex emits with a peak emission in a wavelength range from about 470 nm to about 650 nm. In a further embodiment, the exciplex emits with a peak emission in a wavelength range from about 530 nm to about 650 nm.

The exemplary device produces white light as a result of the blue emission from the polyfluorene-based polymer and the red emission from the exciplex formed at the interface with the small molecule BCP. The sum of these two spectra is broad and provides for a high accuracy white light. It should be appreciated that embodiments of the invention may comprise a hybrid between a thermally evaporated small molecule material and a solution-processed light emissive polymer, and that the shared excited state exists at or near the interface between the two materials. The small molecule and polymer materials constitute two distinct layers and are not blended according to exemplary embodiments of the invention.

Due to the voltage tunable exciplex emissions, this type of OLED can provide for color tuning. For example, by varying the applied voltage between the electrodes, the prominent peak in the emission spectrum may be accurately shifted to different wavelengths. As a result, the emission color of the OLEDs may be not only white but other colors (e.g., blue or purple) as well, depending on the applied voltage. These advantages may make this type of OLED attractive for applications where different correlated color temperatures (CCTs) are needed at different times. An OLED in accordance with embodiments of the present invention may be used as a tunable white light bulb. In addition, since there is only one emissive species according to exemplary embodiments of the invention, differential aging of the devices is typically not a concern. Other applications may include, for example, electronic display boards, traffic lights and color signs.

Figure 3:
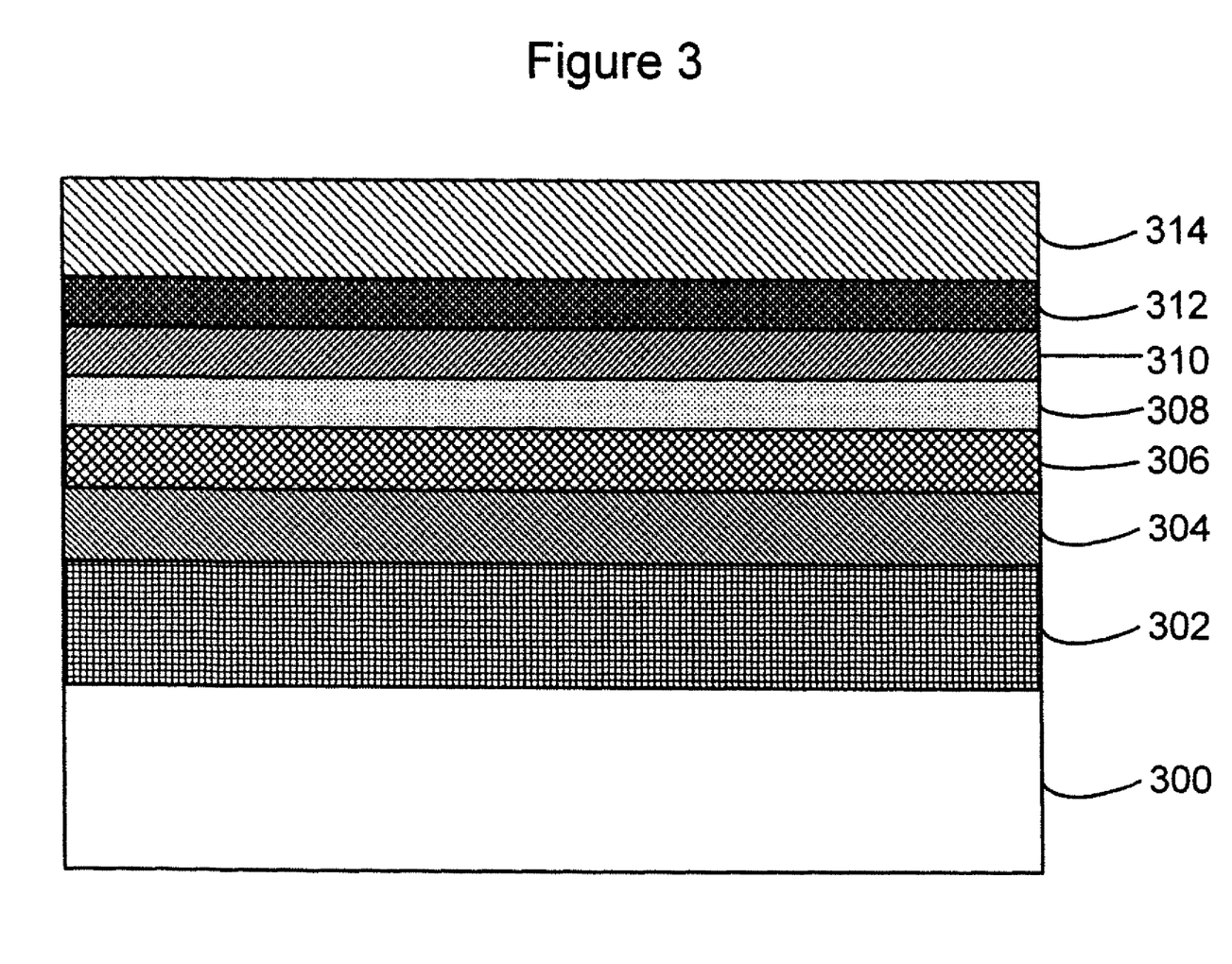
FIG. 3 illustrates a cross-sectional view of another organic light emitting device according to an exemplary embodiment of the invention.

FIG. 3 illustrates a cross-sectional view of another organic light emitting device according to an exemplary embodiment of the invention. This OLED device comprises a glass substrate 300, an ITO anode 302, a PDOT layer 304 as a hole injection layer, a polyfluorene-based blue light emissive polymer layer 306, a BCP layer 308, an Alq$_3$ layer 310 as an electron transport layer, and a cathode comprising a NaF layer 312 and an Al layer 314. Experiments were conducted to examine the characteristics of this structure in producing illumination quality white light.

A number of configurations were tested for the device shown in FIG. 3. For example, the thickness of the BCP layer 308 was varied between 60 and 150 angstroms and the thickness of the NaF layer 312 was varied between 7 and 40 angstroms. In a few test samples, the NaF layer 312 was replaced with a LiF layer approximately 7 angstroms thick. A DC voltage of 6.0 volts was applied between the ITO anode 302 and the Al layer 314.

Figure 4:
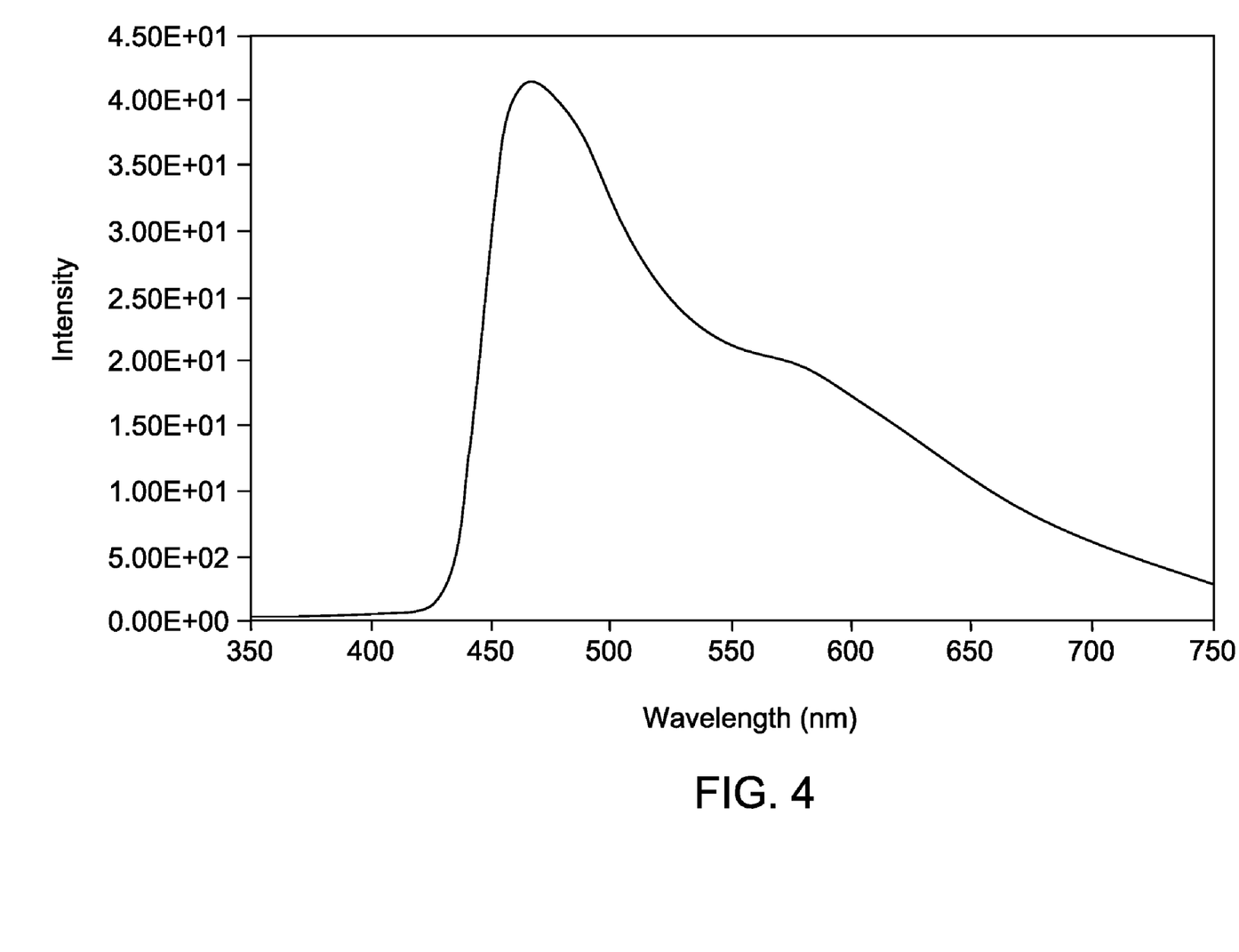
FIG. 4 shows a white light spectrum from the exemplary device shown in FIG. 3.

The resulting exciplex emission, as well as the device characteristics, were measured at drive current densities ranging from 200 μA/cm$^2$ to 200 mA/cm$^2$. FIG. 4 shows a representative white light spectrum from the device shown in FIG. 3. FIG. 4 clearly illustrates two peaks in the emission spectrum. A first peak centered at about 460-470 nm in blue region of the visible wavelength range due to emission characteristic of the polyfluorene based blue emitting polymer and a second broad peak centered at about 633 nanometers with a 120-nanometer full width in the red region of the visible wavelength range characteristic of the exciplex formed at the interface of the polyfluorene and BCP. The combination of the emission in the blue wavelength range and the broad emission in the red results in white light emission.

Figure 5:
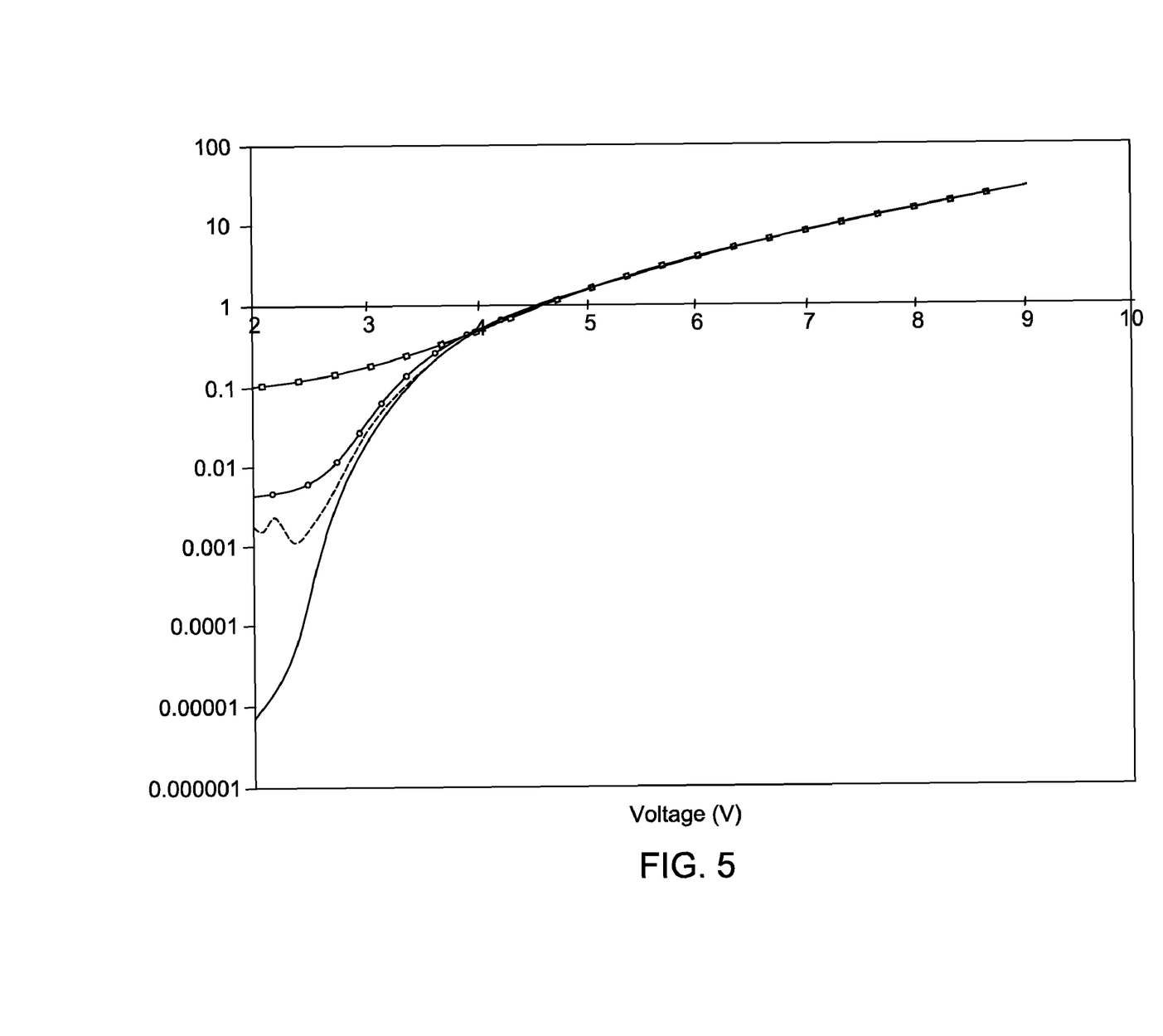
FIG. 5 shows the current-density-voltage characteristics of four display pixels according to an exemplary embodiment of the invention.
Figure 6:
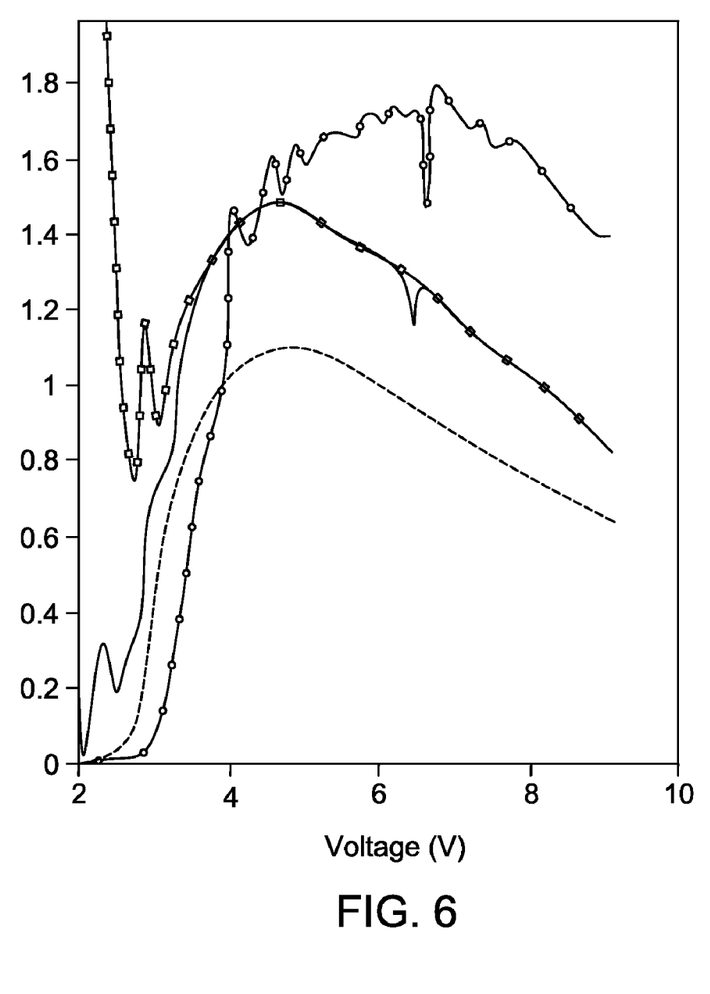
FIG. 6 shows the power efficiency characteristics of four display pixels according to an exemplary embodiment of the invention.

FIG. 5 shows the current-density-voltage characteristics of four display pixels fabricated on one substrate, each pixel having a similar structure to that shown in FIG. 3. FIG. 6 shows the power efficiency characteristics of the four display pixels. As shown FIGS. 5 and 6, the four pixels exhibited some variations in their performance. These variations may be attributed to variations in the fabrication process. For example, one or more layers may have been deposited non-uniformly to some extent over the substrate. Temperature changes in the process may cause one part of a film to have a different amount of stress from another part. These and other factors may cause some differences in the characteristics of devices on the same substrate.

The exciplex emission was peaked at approximately 633 nanometers with a 120-nanometer full width at half maximum. The device, as a light source, typically had a high color rendering index (CRI) of 80-95 with a correlated color temperature (CCT) of 6000-8000 Kelvin. The colors of the OLED light were measured as being centered around (0.3, 0.3) on the Commission Internationale d'Eclairage (CIE) color chart, which means the emissions were substantially white. The testing results confirmed that these OLEDs were capable of illumination-quality white light emissions. The efficiency for the devices to convert electrical power into optical power was also measured in terms of LPWR (lumens per watt ratio). The LPWR ranges from 228 to 366.

In one embodiment of the present invention is a method for color tuning an organic light emitting device emission. The method includes applying a voltage to an organic light emitting device, the device including at least one light emitting polymer and at least one small molecule material adjacent to the at least one light emitting polymer. The small molecule material functions as both a hole blocking and an electron transport material, and upon application of a voltage, the device emits emission including emission from the light emitting polymer at a first wavelength range and emission from an exciplex formed at the interface of the light emitting polymer with the small molecule material at a second wavelength range different from the first wavelength. As the voltage is varied the emission peak of the exciton emission and the exciplex emission is shifted and the color of the net emission is varied.

While the foregoing description includes many details and specificities, it is to be understood that these have been included for purposes of explanation only, and are not to be interpreted as limitations of the present invention. It will be apparent to those skilled in the art that other modifications to the embodiments described above can be made without departing from the spirit and scope of the invention. Accordingly, such modifications and their legal equivalents are considered within the scope of the invention as intended to be encompassed by the following claims.

The invention claimed is:

1. An organic light emitting device capable of white light emissions, the device comprising a light emissive layer consisting of at least one polyfluorene-based blue light emissive polymer directly adjacent to a layer comprising at least one small molecule material capable of hole blocking and electron transport;
 wherein the at least one small molecule material and the at least one light emissive polymer form an exciplex at or near an interface of the light emissive layer and the layer comprising the at least one small molecule material.

2. The organic light emitting device according to claim 1, wherein the at least one small molecule material has a lowest unoccupied molecular orbital (LUMO) value between the LUMO values of two adjacent layers of the at least one small molecule material.

3. The organic light emitting device according to claim 1, wherein a HOMO offset of the small molecule material with respect to the light emissive layer is greater than about 0.5 eV.

4. The organic light emitting device according to claim 1, wherein the bandgap of the small molecule material is larger than the bandgap of blue light emissive polymer in a range from about 0.5 eV to about 2 eV.

5. The organic light emitting device according to claim 1, wherein electron mobility in the layer comprising the at least one small molecule material is greater than about 10-5 cm2/Vs at an electric field of about 0.5 MV/cm.

6. The organic light emitting device according to claim 1, wherein the at least one small molecule material comprises at least one material selected from the group consisting of bathocuproine (BCP) and derivatives thereof, triazole and derivatives thereof, oxidazole and derivatives thereof, and combinations thereof.

7. The organic light emitting device according to claim 1, wherein the exciplex emits with a peak emission at a wavelength greater than about 550 nm.

8. The organic light emitting device according to claim 1, wherein the exciplex emits with a peak emission at a wavelength greater than about 600 nm.

9. The organic light emitting device according to claim 1, wherein the at least one light emissive polymer is formed by a solution-cast process and the at least one small molecule material is formed by an evaporation process.

10. The organic light emitting device according to claim 1, wherein the device has a multilayer structure on a substrate, the multilayer structure comprising a plurality of layers starting from the substrate in the following order:
 (a) an anode;
 (b) at least one hole injection layer or hole transport layer;
 (c) the at least one light emissive polymer;
 (d) the at least one small molecule material;
 (e) one or more electron transport layers; and
 (f) a cathode.

11. The organic light emitting device according to claim 1, wherein the device has a multilayer structure on a substrate, the multilayer structure comprising a plurality of materials starting from the substrate in the following order:
 (a) indium tin oxide (ITO);
 (b) polyethylenedioxythiophene (PDOT);
 (c) A polyfluorene-based blue light emissive polymer;
 (d) bathocuproine (BCP);
 (e) tris(8-hydroxy-quinoline)aluminum (Alq3);
 (f) sodium fluoride (NaF) or lithium fluoride (LiF); and
 (g) aluminum (Al).

* * * * *